(12) United States Patent
Wang et al.

(10) Patent No.: US 10,461,200 B1
(45) Date of Patent: Oct. 29, 2019

(54) SEMICONDUCTOR STRUCTURE AND MANUFACTURING METHOD THEREOF

(71) Applicant: United Microelectronics Corp., Hsinchu (TW)

(72) Inventors: Wen-Chieh Wang, Hsinchu (TW); Chuan-Sheng Liu, New Taipei (TW); Bo-Cheng Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 16/054,938

(22) Filed: Aug. 3, 2018

(30) Foreign Application Priority Data

Jul. 13, 2018 (CN) .......................... 2018 1 0769160

(51) Int. Cl.
*H01L 27/14* (2006.01)
*H01L 31/0216* (2014.01)
*F21V 8/00* (2006.01)
*H01L 31/0232* (2014.01)
*H01L 31/18* (2006.01)
*G03F 7/00* (2006.01)

(52) U.S. Cl.
CPC ...... *H01L 31/02165* (2013.01); *G02B 6/0036* (2013.01); *G03F 7/0035* (2013.01); *H01L 31/02164* (2013.01); *H01L 31/02327* (2013.01); *H01L 31/18* (2013.01)

(58) Field of Classification Search
USPC ... 257/431, 81, 82, 116, 117, 432–437, 457, 257/459, 749; 438/51, 55, 64–68, 83, 98
See application file for complete search history.

(56) References Cited

U.S. PATENT DOCUMENTS

| | | | |
|---|---|---|---|
| 7,947,430 B2 | 5/2011 | Fu et al. | |
| 8,542,311 B2* | 9/2013 | Lenchenkov | H01L 27/14629 257/432 |
| 9,978,795 B1 | 5/2018 | Lin et al. | |
| 2005/0236553 A1* | 10/2005 | Noto | H01L 27/14621 250/208.1 |

* cited by examiner

*Primary Examiner* — Niki H Nguyen
(74) *Attorney, Agent, or Firm* — J.C. Patents

(57) ABSTRACT

A semiconductor structure including a substrate, a light sensing device and a light-guiding structure is provided. The light sensing device is disposed in the substrate. The light-guiding structure is located above the light sensing device. The light-guiding structure has a top surface and a bottom surface opposite to each other, and the bottom surface is closer to the substrate than the top surface. A position of a minimum width of the light-guiding structure is located between the top surface and the bottom surface.

20 Claims, 1 Drawing Sheet

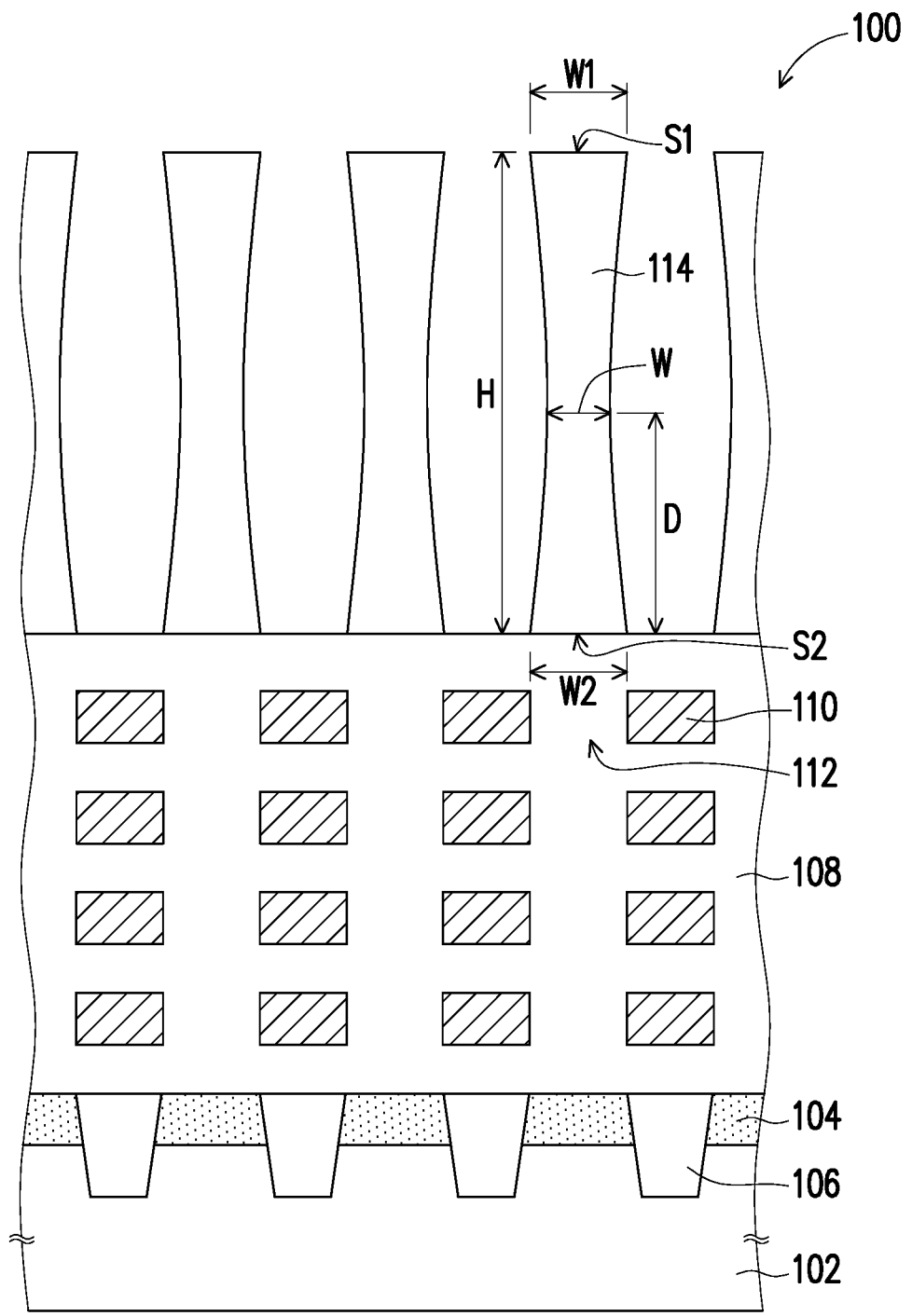

SEMICONDUCTOR STRUCTURE AND MANUFACTURING METHOD THEREOF

CROSS-REFERENCE TO RELATED APPLICATION

This application claims the priority benefit of China application serial no. 201810769160.0, filed on Jul. 13, 2018. The entirety of the above-mentioned patent application is hereby incorporated by reference herein and made a part of this specification.

BACKGROUND

1. Field of the Invention

The present invention generally relates to semiconductor structure and manufacturing method thereof, and particularly to semiconductor structure and manufacturing method thereof with light-guiding structure.

2. Description of Related Art

When a light-guiding pillar is manufactured based on photoresist material in the current technology, an issue about collapse of the light-guiding pillar would easily occur if the rotation speed in developing procedure is too fast. If the rotation speed in developing procedure is too slow, it easily causes the photoresist residue and the increase of manufacturing time. In addition, it is still another issue to be intendedly solved that the signal of the light-guiding pillar is interfered by the scattering light thereon.

SUMMARY OF THE INVENTION

The invention provides a semiconductor structure and manufacturing method thereof, which can reduce the manufacturing time and effectively reduce the signal interference from the scattering light.

The invention provides a semiconductor structure, including a substrate, a light sensing device and a light-guiding structure. The light sensing device is disposed in the substrate. The light-guiding structure is located above the light sensing device. The light-guiding structure has a top surface and a bottom surface opposite to each other, and the bottom surface is closer to the substrate than the top surface. A position of a minimum width of the light-guiding structure is located between the top surface and the bottom surface.

According to an embodiment of the invention, in the semiconductor structure, the light-guiding structure can be aligned to the light sensing device.

According to an embodiment of the invention, in the semiconductor structure, a material of the light-guiding structure is a negative photoresist in an example.

According to an embodiment of the invention, in the semiconductor structure, a width of the top surface and a width of the bottom surface can be respectively larger the minimum width.

According to an embodiment of the invention, in the semiconductor structure, a distance between the position of the minimum width and the bottom surface in an example is ⅓ to ⅔ of a height of the light-guiding structure.

According to an embodiment of the invention, in the semiconductor structure, a shape of the light-guiding structure can be an hourglass shape.

According to an embodiment of the invention, in the semiconductor structure, the light-guiding structure is a light-guiding pillar in an example.

According to an embodiment of the invention, in the semiconductor structure, a ratio of height to width of the light-guiding structure is 5 to 15 in an example.

According to an embodiment of the invention, in the semiconductor structure, a height of the light-guiding structure is 90 microns to 135 microns in an example.

According to an embodiment of the invention, in the semiconductor structure, the minimum width of the light-guiding structure is 9 microns to 15 microns in an example.

According to an embodiment of the invention, the semiconductor structure further comprises a dielectric layer and a plurality of metal patterns. The dielectric layer is disposed on the substrate. The light-guiding structure can be disposed on the dielectric layer. The metal patterns are disposed in the dielectric layer. The metal patterns have a gap therebetween and the gap is aligned to the light sensing device.

The invention provides a manufacturing method for semiconductor structure, including the following steps. A substrate is provided. The substrate has a light sensing device therein. A light-guiding structure is formed above the light sensing device. The light-guiding structure has a top surface and a bottom surface opposite to each other and the bottom surface is closer to the substrate than the top surface. A position of a minimum width of the light-guiding structure is located between the top surface and the bottom surface.

According to an embodiment of the invention, in the manufacturing method for semiconductor structure, the step of forming the light-guiding structure in an example is performing a lithographic process. The lithographic process can comprise a photoresist coating process, a light exposure process and a developing process.

According to an embodiment of the invention, in the manufacturing method for semiconductor structure, a focusing position of the light exposure process can be located between the top surface and the bottom surface.

According to an embodiment of the invention, in the manufacturing method for semiconductor structure, the minimum width can be located at the focusing position.

According to an embodiment of the invention, in the manufacturing method for semiconductor structure, a distance between the focusing position and the bottom surface in an example is ⅓ to ⅔ of a height of the light-guiding structure.

According to an embodiment of the invention, in the manufacturing method for semiconductor structure, a rotation speed of the developing process is 850 rpm to 2000 rpm in an example.

According to an embodiment of the invention, in the manufacturing method for semiconductor structure, a developing time of the developing process is 6 minutes to 15 minutes in an example.

According to an embodiment of the invention, in the manufacturing method for semiconductor structure, the light-guiding structure can be aligned to the light sensing device.

According to an embodiment of the invention, the manufacturing method for semiconductor structure can further comprise forming a dielectric layer on the substrate. The light-guiding structure can be disposed on the dielectric layer. A plurality of metal patterns can be formed in the dielectric layer. The metal patterns have a gap therebetween and the gap is aligned to the light sensing device.

As to the descriptions above, in the semiconductor structure and the manufacturing method thereof of the invention, due to the specific structure that the position of the minimum width of the light-guiding structure is located between the top surface and the bottom surface of the light-guiding structure, the light-guiding structure can be formed by the developing process with higher rotation speed. The situation about collapse of light-guiding structure would not occur. In addition, since the developing process with higher rotation speed can be used to form the light-guiding structure, the manufacturing time can be effectively reduced and the photoresist residue can be avoided. Further, since the light-guiding structure has the specific structure above, the light-guiding structure can filter the scattering light and thereby reduce the interference from the scattering light.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a drawing, schematically illustrating a cross-sectional view of the semiconductor structure, according to an embodiment of the invention.

DESCRIPTION OF THE EMBODIMENTS

FIG. 1 is a drawing, schematically illustrating a cross-sectional view of the semiconductor structure, according to an embodiment of the invention. In the following, FIG. 1 is taken for describing the manufacturing method of the semiconductor structure 100. The semiconductor structure 100 can be applied to various structures in light sensing device, such as an optical fingerprint recognition device.

Firstly, a substrate 102 is provided. The substrate 102 can be silicon substrate in an example. A light sensing device 104 is in the substrate 102. The light sensing device 104 in an example is a light emitting diode but the invention is not just limited thereto. In addition, an isolation structure 106 can be further included in the substrate 102 and the light sensing device 104 can be located between adjacent two isolation structures 106. The isolation structure 106 in an example is a shallow trench isolation (STI) structure. Material of the isolation structure 106 in an example is silicon oxide.

Further, a dielectric layer 108 can be formed on the substrate 102. The dielectric layer 108 can be single-layer structure or multiple-layer structure. In the situation of multiple-layer structure for the dielectric layer 108, a top layer of the dielectric layer 108 can serve as the protection layer. Material of the dielectric layer 108 in an example can be silicon oxide, silicon nitride or a combination thereof. The method to form the dielectric layer 108 in an example is chemical vapor deposition.

After then, multiple metal patterns 110 can be formed in the dielectric layer 108. There is a gap 112 between the metal patterns 110 and the gap 112 is aligned to the light sensing device 104. The metal patterns 110 can be used to shield the scattering light, so to avoid the occurrence about the interference from the scattering light. Material of the metal patterns 110 in an example is copper, aluminium, or tungsten. The method for forming the metal patterns 110 for shielding light in an example is metal damascene process or further in combination with deposition process with lithographic and etching processes. In an embodiment, the metal patterns 110 are formed in four layers as an example for descriptions but the invention is not just limited thereto. The person with the ordinary skill in the art can determine the number of layers for the metal patterns 110, according to the actual need for the product. In addition, a width of the gap 112 can be properly reduced to have a better effect for filtering light.

After then, a light-guiding structure 114 is formed above the light sensing device 104. In an embodiment, the light-guiding structure 114 can be formed on the dielectric layer 108, which is formed above the light sensing device 104 but the invention is not just limited thereto. The light-guiding structure 114 can be used as a light pipe. The light-guiding structure 114 can be aligned to the light sensing device 104. The light-guiding structure 114 in an example is light-guiding pillar. Material of the light-guiding structure 114 in an example is negative photoresist. A ratio of height to width of the light-guiding structure 114 in an example is 5 to 15. In an embodiment, the ratio of height to width is defined as the ratio of the height H of the light-guiding structure 114 to the minimum width W of the light-guiding structure 114. The height H of the light-guiding structure 114 in an example is 90 microns to 135 microns. The minimum width W of the light-guiding structure 114 in an example is 9 microns to 15 microns.

The light-guiding structure 114 has a top surface S1 and a bottom surface S2 opposite to each other. The bottom surface S2 is closer to the substrate 102 than the top surface S1. A position of the minimum width W of the light-guiding structure 114 is located between the top surface S1 and the bottom surface S2. A width W1 of the top surface S1 and a width W2 of the bottom surface S2 are respectively larger than the minimum width W, so the shape of the light-guiding structure 114 can be an hourglass shape. A distance between the position of the minimum width W of the light-guiding structure 114 and the bottom surface is ⅓ to ⅔ of a height of the light-guiding structure 114. In addition, the closer the position of the minimum width W of the light-guiding structure 114 is to the bottom surface S2, the light guiding structure 114 can have a better filtering effect.

The method to form the light-guiding structure 114 in an example is performing a lithographic process. The lithographic process can include a photoresist coating process, a light exposure process and a developing process. During the photoresist coating process, the photoresist material used in the photoresist coating process in an example is a negative photoresist. During the light exposure process, a focusing position of the light exposure process can be located between the top surface S1 and the bottom surface S2, so the position of the minimum width W of the light-guiding structure 114 can be located at the focusing position. The distance between the focusing position and the bottom surface S2 in an example is ⅓ to ⅔ of a height of the light-guiding structure 114. The rotation speed in the developing process in an example is 850 rpm to 2000 rpm. The developing time of the developing process in an example is 6 minutes to 15 minutes.

In a further embodiment, although not shown in FIG. 1, a top layer of the metal pattern 110 can be further formed over the top surface of the dielectric layer 108 and the bottom of the light-guiding structure 114 can be located within the gap 112, which is between adjacent two metal patterns 110 of the top layer. In this situation, an insulating layer (not shown) can be further formed for covering the top layer of the metal patterns 110 and the insulating layer can isolate the light-guiding structure 114 from the metal patterns 110 of the top layer.

In following, FIG. 1 is taken for describing the semiconductor structure 100. In addition, although the method to form the semiconductor structure 100 is described above as an example, the invention is not just limited thereto.

Referring to FIG. 1, semiconductor structure 100 includes a substrate 102, a light sensing device 104 and a light-guiding structure 114, and can further include an isolation structure 106, a dielectric layer 108, and at least one of multiple metal patterns 110. The light sensing device 104 is disposed in the substrate 102. The light-guiding structure 114 is located above the light sensing device 104. The light-guiding structure 114 has a top surface S1 and a bottom surface S2 opposite to each other and the bottom surface S2 is closer to the substrate 102 than the top surface S1. A position of the minimum width W of the light-guiding structure 114 is located between the top surface S1 and the bottom surface S2. The light-guiding structure 114 can be aligned to the light sensing device 104. An isolation structure 106 is disposed in the substrate 102 and the light sensing device 104 can be located between adjacent two isolation structures 106. The dielectric layer 108 is disposed on the substrate 102. Metal patterns 110 are disposed on the dielectric layer 108. A gap 112 is located between the metal patterns 110 and the gap 112 is aligned to the light sensing device 104. The light-guiding structure 112 can be disposed on the dielectric layer 108. In addition, material, disposing manner, formation manner, dimension and functionality for each of the elements of the semiconductor structure 100 have been described in detail in above embodiments. The descriptions are no longer repeated.

As to the foregoing embodiments, in the semiconductor structure 100 and the manufacturing method thereof, due to the specific structure that the position of the minimum width W of the light-guiding structure 114 is located between the top surface S1 and the bottom surface S2 of the light-guiding structure 114, the light-guiding structure 114 can be formed by the developing process with higher rotation speed. The situation about collapse of light-guiding structure 114 would not occur. In addition, since the developing process with higher rotation speed can be used to form the light-guiding structure 114, the manufacturing time can be effectively reduced and the photoresist residue can be avoided. Further, since the light-guiding structure 114 has the specific structure above, the light-guiding structure 114 can effectively reduce the signal interference from the scattering light.

As to the foregoing descriptions, in the semiconductor structure 100 and the manufacturing method thereof, due to the specific structure that the position of the minimum width of the light-guiding structure is located between the top surface and the bottom surface of the light-guiding structure, thereby, it can be achieved at the same time for avoiding collapse of the light-guiding structure under the developing process with a high rotation speed, reducing the manufacturing time, and reducing signal interference from scattering light.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A semiconductor structure, comprising:
a substrate;
a light sensing device, disposed in the substrate; and
a light-guiding structure, located above the light sensing device, having a top surface and a bottom surface opposite to each other, wherein the bottom surface is closer to the substrate than the top surface and a position of a minimum width of the light-guiding structure is located between the top surface and the bottom surface.

2. The semiconductor structure as recited in claim 1, wherein the light-guiding structure is aligned to the light sensing device.

3. The semiconductor structure as recited in claim 1, wherein a material of the light-guiding structure comprises a negative photoresist.

4. The semiconductor structure as recited in claim 1, wherein a width of the top surface and a width of the bottom surface are respectively larger the minimum width.

5. The semiconductor structure as recited in claim 1, wherein a distance between the position of the minimum width and the bottom surface is 1/3 to 2/3 of a height of the light-guiding structure.

6. The semiconductor structure as recited in claim 1, wherein a shape of the light-guiding structure comprises an hourglass shape.

7. The semiconductor structure as recited in claim 1, wherein the light-guiding structure comprises a light-guiding pillar.

8. The semiconductor structure as recited in claim 1, wherein a ratio of height to width of the light-guiding structure is 5 to 15.

9. The semiconductor structure as recited in claim 1, wherein a height of the light-guiding structure is 90 microns to 135 microns.

10. The semiconductor structure as recited in claim 1, wherein the minimum width of the light-guiding structure is 9 microns to 15 microns.

11. The semiconductor structure as recited in claim 1, further comprising:
a dielectric layer, disposed on the substrate, wherein the light-guiding structure is disposed on the dielectric layer; and
a plurality of metal patterns, disposed in the dielectric layer, wherein the metal patterns have a gap therebetween and the gap is aligned to the light sensing device.

12. A manufacturing method for semiconductor structure, comprising:
providing a substrate;
forming a light sensing device in the substrate; and
forming a light-guiding structure above the light sensing device, wherein the light-guiding structure has a top surface and a bottom surface opposite to each other, the bottom surface is closer to the substrate than the top surface, and a position of a minimum width of the light-guiding structure is located between the top surface and the bottom surface.

13. The manufacturing method for semiconductor structure as recited in claim 12, wherein the step of forming the light-guiding structure comprises performing a lithographic process and the lithographic process comprises a photoresist coating process, a light exposure process and an developing process.

14. The manufacturing method for semiconductor structure as recited in claim 13, wherein a focusing position of the light exposure process is located between the top surface and the bottom surface.

15. The manufacturing method for semiconductor structure as recited in claim 14, wherein the position of the minimum width is located at the focusing position.

16. The manufacturing method for semiconductor structure as recited in claim 14, wherein a distance between the focusing position and the bottom surface is ⅓ to ⅔ of a height of the light-guiding structure.

17. The manufacturing method for semiconductor structure as recited in claim 13, wherein a rotation speed of the developing process is 850 rpm to 2000 rpm.

18. The manufacturing method for semiconductor structure as recited in claim 13, wherein a developing time of the developing process is 6 minutes to 15 minutes.

19. The manufacturing method for semiconductor structure as recited in claim 12, wherein the light-guiding structure is aligned to the light sensing device.

20. The manufacturing method for semiconductor structure as recited in claim 12, further comprising:
   forming a dielectric layer on the substrate, wherein the light-guiding structure is disposed on the dielectric layer; and
   forming a plurality of metal patterns in the dielectric layer, wherein the metal patterns have a gap therebetween and the gap is aligned to the light sensing device.

* * * * *